(12) United States Patent
Hori (10) Patent No.: US 7,482,700 B2
(45) Date of Patent: Jan. 27, 2009

(54) SEMICONDUCTOR DEVICE HAVING PROJECTION ON SURFACE THEREOF, AND METHOD OF IDENTIFYING SEMICONDUCTOR PACKAGE (75) Inventor: Norifumi Hori, Yanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 311 days.

(21) Appl. No.: 11/234,281

(22) Filed: Sep. 26, 2005

(65) Prior Publication Data
US 2006/0076675 A1   Apr. 13, 2006

(30) Foreign Application Priority Data
Sep. 27, 2004 (JP) ............................. 2004-279821

(51) Int. Cl.
*H01L 23/28* (2006.01)
*B29C 45/14* (2006.01)
*A23G 1/22* (2006.01)

(52) U.S. Cl. ............... 257/787; 257/731; 257/E23.003; 257/E23.125; 264/272.15; 264/272.17; 264/275; 264/276; 264/328.11; 264/511; 425/116; 425/117; 425/169; 425/170

(58) Field of Classification Search ......... 257/678–733, 257/787–796, E23.001–E23.194; 264/272.15, 264/272.17, 275, 276, 328.11, 511; 425/169, 425/170
See application file for complete search history.

(56) References Cited

U.S. PATENT DOCUMENTS

| 4,641,418 | A | * | 2/1987 | Meddles | 264/272.17 |
| 6,106,259 | A | * | 8/2000 | Lee et al. | 425/116 |
| 6,191,359 | B1 | * | 2/2001 | Sengupta et al. | 174/564 |
| 6,692,993 | B2 | * | 2/2004 | Li et al. | 438/126 |
| 2005/0089593 | A1 | * | 4/2005 | Wang et al. | 425/116 |

FOREIGN PATENT DOCUMENTS

JP  62238616  10/1989

* cited by examiner

*Primary Examiner*—Jasmine J Clark
(74) *Attorney, Agent, or Firm*—Young & Thompson (57) ABSTRACT A technique of accurately recognizing a semiconductor device and of specifying a package type thereof. By forming, on the package surface, projections having a geometric pattern such as a circle pattern using an ejector pin and by judging only presence or absence of the circular projections using an image processor, it is possible to reduce a risk of recognition failure of the geometric pattern even if the pattern has some omission in the constitutive line thereof or has any addition of a new line. For example, when the circular projections are provided on the surface of a package, an image processor reads only presence or absence of the circular projections even if disconnection of the line or addition of a line should occur, and this allows the circular projections to be always read as being "present".

14 Claims, 7 Drawing Sheets

RELATED ART

FIG. 10A

RELATED ART

FIG. 10B

RELATED ART

FIG. 10C

RELATED ART

FIG. 10D

RELATED ART

SEMICONDUCTOR DEVICE HAVING PROJECTION ON SURFACE THEREOF, AND METHOD OF IDENTIFYING SEMICONDUCTOR PACKAGE

This application is based on Japanese patent application No. 2004-279821 the content of which is incorporated hereinto by reference.

DISCLOSURE OF THE INVENTION

1. Field of the Invention

The present invention relates to a semiconductor device having a projection on the surface thereof, and a method of identifying a semiconductor package.

2. Related Art

Figure 9:
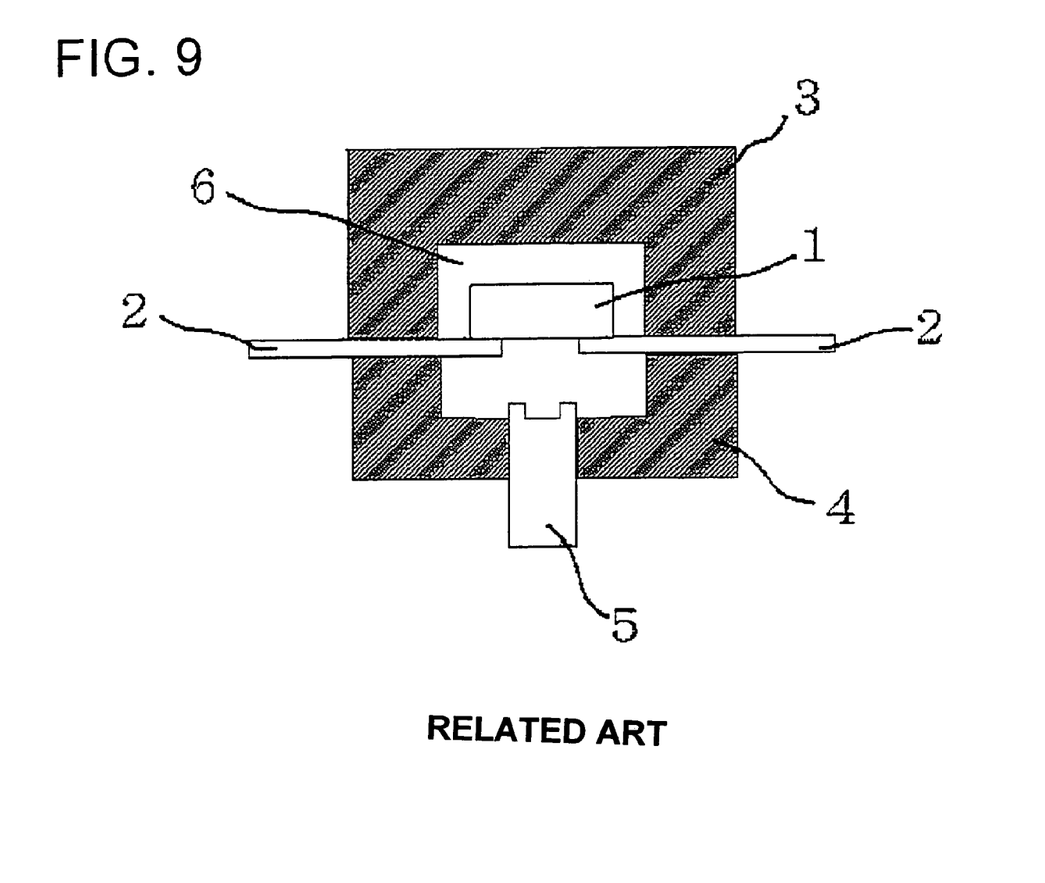
FIG. 9 is a sectional view showing a semiconductor device according to the prior art.

A known example of conventional semiconductor device having a projection on the surface of its package is described, for example, in Japanese Laid-Open Patent Publication No. 62-238616. The semiconductor device described in the literature is shown in FIG. 9.

In a process of fabricating the semiconductor device, an ejector pin 5, having characters and marks carved to a depth of approximately 0.05 mm on the end surface thereof, is disposed so that the end surface thereof is projected by 0.05 to 0.1 mm out from the bottom surface of a lower die 4. A main capacitor unit 1 is bonded to electrode draw-out portions 2, the electrode draw-out portions 2 are positioned on a lower die 4 and then clapped by an upper die 3, to thereby tightly enclose the main capacitor unit 1. A resin is injected under pressure into a space 6 around the tightly enclosed main capacitor unit 1, and allowed to cure in the die, to thereby produce a mold-packaged stacked film capacitor having embossed characters and marks. Molding of an electronic component using an mold die having the characters and marks carved on the end surface of the ejector pin 5 makes it possible to know in which cavity the product was molded simply by observing the final product, and thereby to trace quality of the product.

Successive processing in the above-described fabrication process of the semiconductor device may, however, raise a need of altering the process conditions for each product.

Among others, for the case where any post-processes of molding of the semiconductor device need alteration of process conditions for each of a plurality of cavities in one mold die, it is necessary, in a continuous operation, to read a feature capable of characterizing each semiconductor device, such as cavity stamp mark for each semiconductor device, and to immediately change the process conditions. Reading of the cavity stamp mark is thus necessary, but an improved accuracy of reading of the cavity stamp mark is also necessary, because any recognition failure results in false processing. It is therefore necessary to use an automatic recognition device such as image processor.

The cavity stamp marks in the prior art was provided for the convenience of visual inspection, and was given as characters or marks, because they were all enough to be readable by human. Any scratches or foul, however, sometimes misled the automatic recognition device such as image processor to read them as different characters, or resulted in so-called recognition failure, and consequently resulted in false processing.

A mechanism of the above-described recognition failure is as follows.

The image processor recognizes the characters or marks, given in a single color, based on reflected light ascribable to the solid form thereof. In this method, any scratches or foul, besides the stamped mark, would also reflect the light and would appear on the image processor. This results in capture of image data having excessive lines or disconnection in the characters or marks. They were sometimes recognized as other characters and were causative of recognition failure.

Figure 10A:
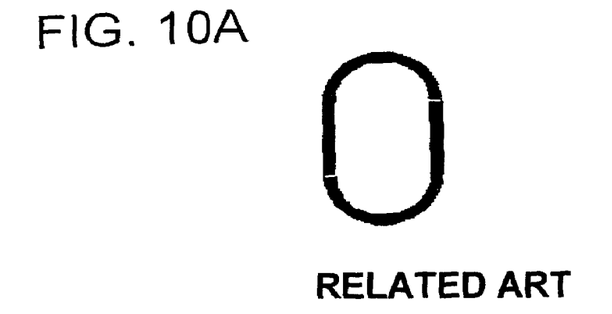
FIGS. 10A to 10D are drawings explaining problems in stamp mark patterns according to the prior art.
Figure 10B:
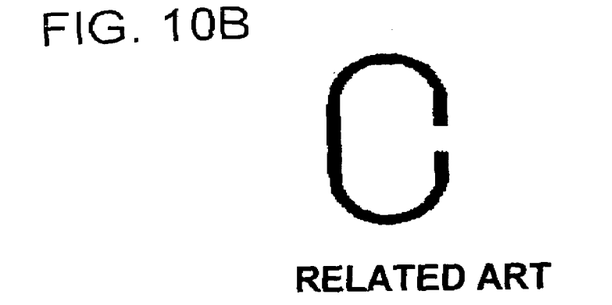
Figure 10C:
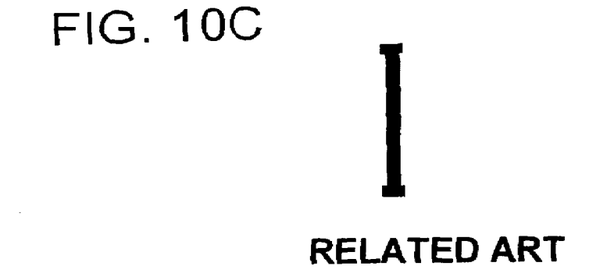
Figure 10D:
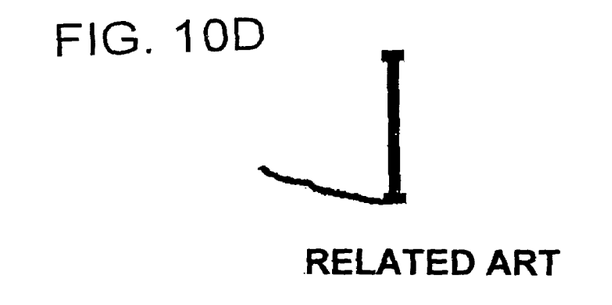

In an exemplary case where an alphabetical character "O" shown in FIG. 10A has disconnection such as shown in FIG. 10B, the image processor may falsely recognize this character as "C". In another exemplary case where an alphabetical character "I" shown in FIG. 10C has a scratch in a form of transverse line as shown in FIG. 10D, the image processor may falsely recognize this character as "J".

The present invention was conceived after considering the above-described situations, and is to provide a technique of accurately recognizing a semiconductor device, and specifying a package type of the semiconductor device.

SUMMARY OF THE INVENTION

According to the present invention, there is provided a semiconductor device comprising: a chip; and a package for sealing the chip therein; wherein, the package has, on the surface thereof, a region in which a projection may be formed, and the package is configured so as to allow determination of a package type of said semiconductor device by judging presence or absence of the projection in the region.

The semiconductor device according to the present invention is such as having, on the surface thereof, a region in which a projection may be formed. This consequently makes it possible to provide a technique allowing accurate recognition of the semiconductor device by judging presence or absence of the projection, and determination of a package type of the semiconductor device.

According to the present invention, there is also provided a method of identifying a semiconductor package, comprising: capturing image information of a predetermined region of the surface of the semiconductor package into an image processor; judging, in the image processor, presence or absence of a projection in the predetermined region, based on the image information; and identifying a type of the semiconductor package based on a result of the judgment.

According to this invention, it is made possible to judge presence or absence of the projection in the predetermined region on the image processor having image information of the surface of a semiconductor package captured therein, and to identify a type of the semiconductor package based on a result of the judgment. This consequently makes it possible to provide a technique allowing accurate recognition of the semiconductor device, and determination of a package type of the semiconductor device.

According to the present invention, there is provided a technique allowing accurate recognition of the semiconductor device and determination of a package type of the semiconductor device, by providing a region, on the surface of the semiconductor device, in which a projection may be formed, and by judging presence or absence of the projection.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following paragraphs will describe embodiments of the present invention referring to the attached drawings. All common constituents will be given with similar reference numerals, allowing omission of explanations therefor on occasions.

First Embodiment

Figure 1:
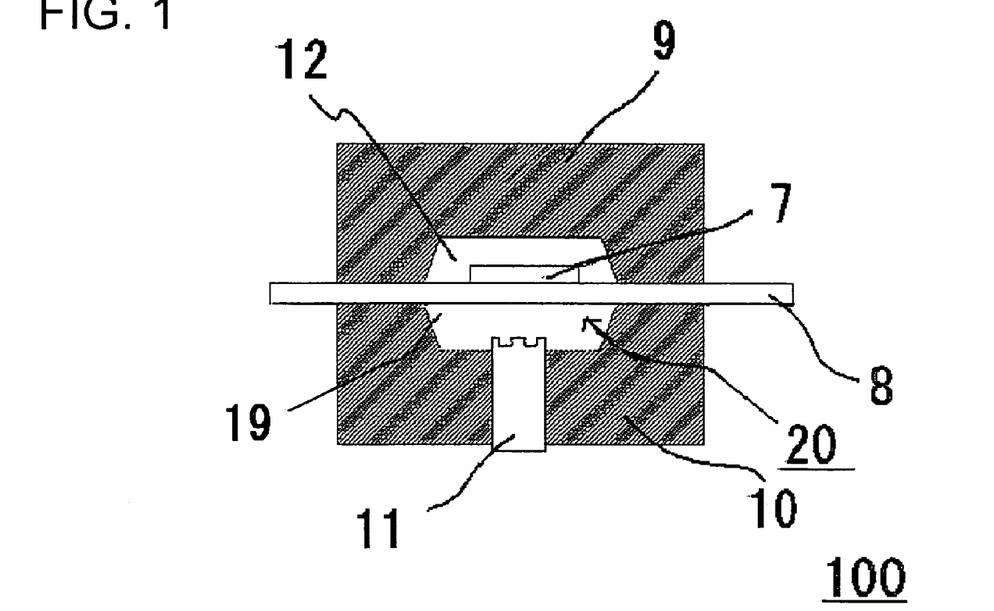
FIG. 1 is a sectional view schematically showing a mold die according to an embodiment.

A configuration of a mold die 100 used in the first embodiment is shown in FIG. 1. The mold die 100 herein is used in a process step of fabricating a package 20 of a semiconductor device described later.

An upper die 9 and a lower die 10 are combined to form a space 12 between the upper die 9 and the lower die 10.

A chip 7 is placed in the space 12, and is molded by a sealing resin 19. The chip 7 used herein is typically a semiconductor chip.

A lead 8 is a substrate on which the chip 7 is placed, and constitutes a part of a lead frame.

An ejector pin 11 is provided to the mold die 100 in order to eject the package 20, after the chip 7 being molded by the sealing resin 19 in the fabrication process of the package, out from the upper die 9 and the lower die 10. The ejector pin 11, having a circle stamp mark (recess) on the end surface thereof, is set so that the end surface thereof is projected by 0.05 to 0.3 mm out from the bottom surface of a lower die 10.

A thermosetting resin can typically be used as the sealing resin 19.

Figure 2:
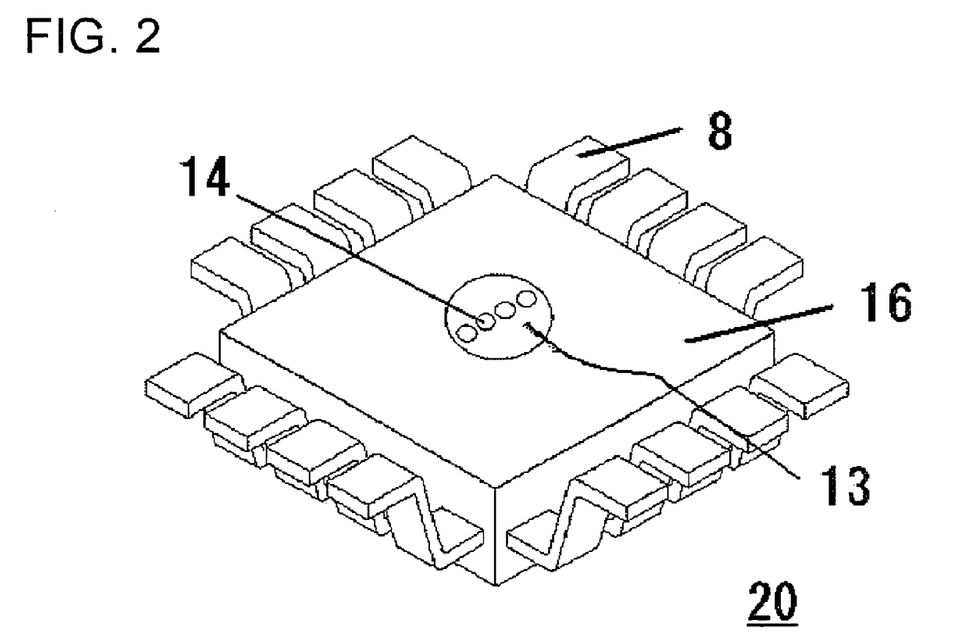
FIG. 2 is a perspective view showing a semiconductor device according to an embodiment.

An appearance of the package 20 having the chip 7 molded therein using the mold die 100 is shown in FIG. 2.

The chip 7 (FIG. 1) is bonded to the lead 8, the lead 8 is positioned by the lower die 10 (FIG. 1) and clamped by the upper die 9 (FIG. 1), to thereby tightly enclose the chip 7. The sealing resin 19 is injected into the space 12 around the tightly enclosed chip 7, cured therein, and ejected by the ejector pin 11, having the stamp mark on the end surface thereof, out from the mold die 100, to thereby produce the package 20 having stamped circle marks on the surface thereof. An ejector pin land area 13 herein is given as a circular recess, and a stamp marking area 14 is given as having circular projections.

The stamp marking area 14 typically comprises a set of circular projections of approximately 1 mm in diameter, disposed at predetermined positions. Each position in the stamp marking area 14 follows a rule defined cavity-by-cavity, and may have no, or one projection, depending on package types. In other words, the stamp marking area 14 has a plurality of sub-areas in which the circular projections may be formed, and each of the circular projections is provided at a specified position (specified sub-area) in the above-described area depending on package types. In the first embodiment, four above-described positions are respectively allocated to the fourth bit, third bit, second bit and first bit, corresponding to each cavity number of the mold die expressed in a binary code, conforming to a rule such that a position corresponded to bit "1" will have a circular projection and a position corresponded to bit "0" will have no circular projection. Combination of "presence" and "absence" of four circular projections is uniquely defined for a single cavity.

Figure 3:
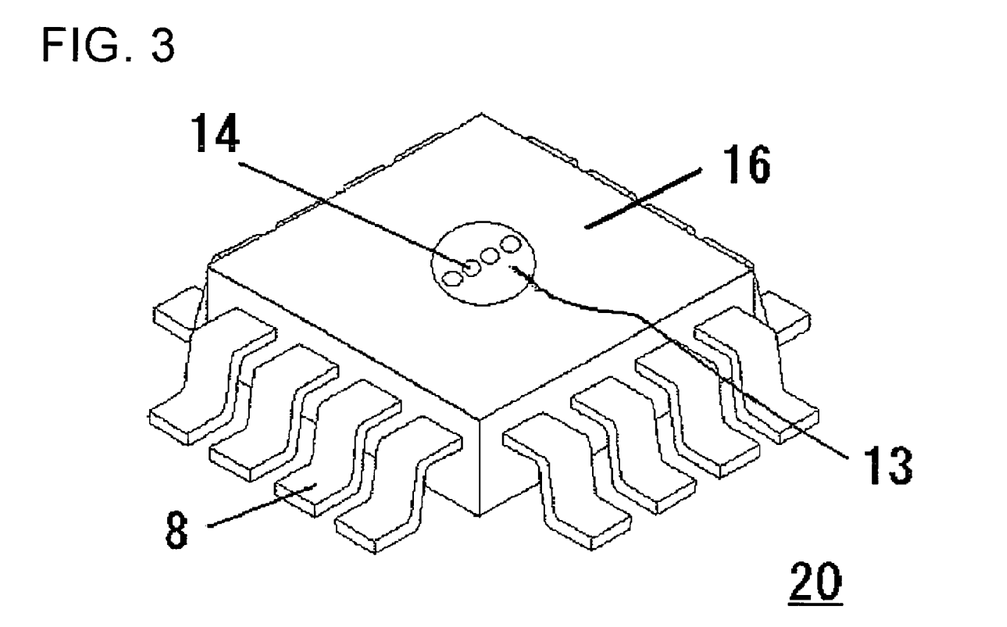
FIG. 3 is a perspective view showing a semiconductor device according to an embodiment.
Figure 4:
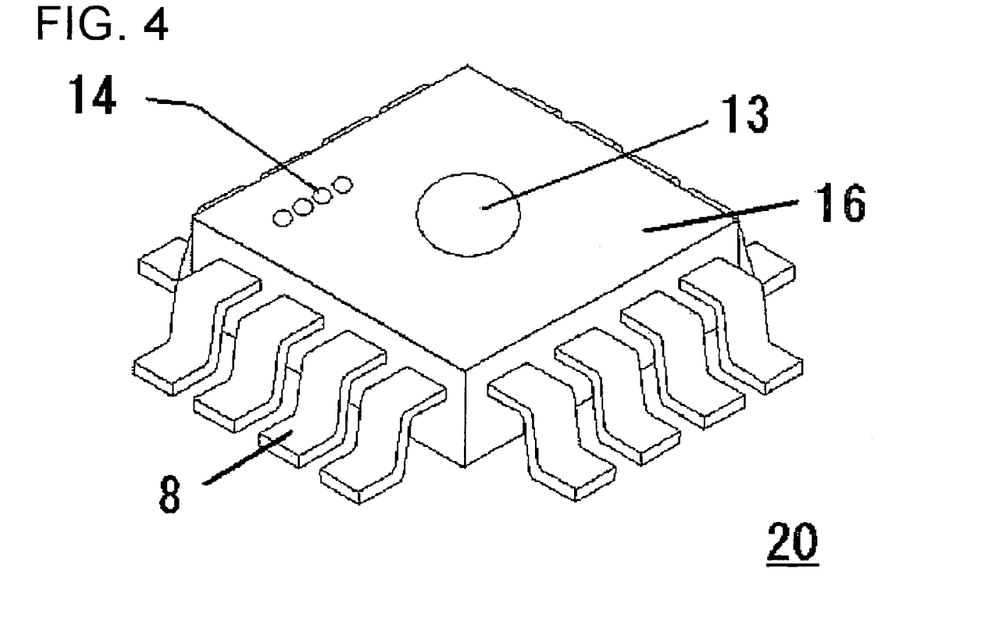
FIG. 4 is a perspective view showing a semiconductor device according to an embodiment.

The circular pattern may be provided on the top surface side of the package 20, as shown in FIG. 3, by giving the stamp marks on the ejector pin pushing out the surface of the package, or may be provided on the top surface side of the package 20, but outside the ejector pin land area 13, as shown in FIG. 4, by providing the stamp marks (recesses) on the inner surface of the mold die forming the cavity.

Figure 5:
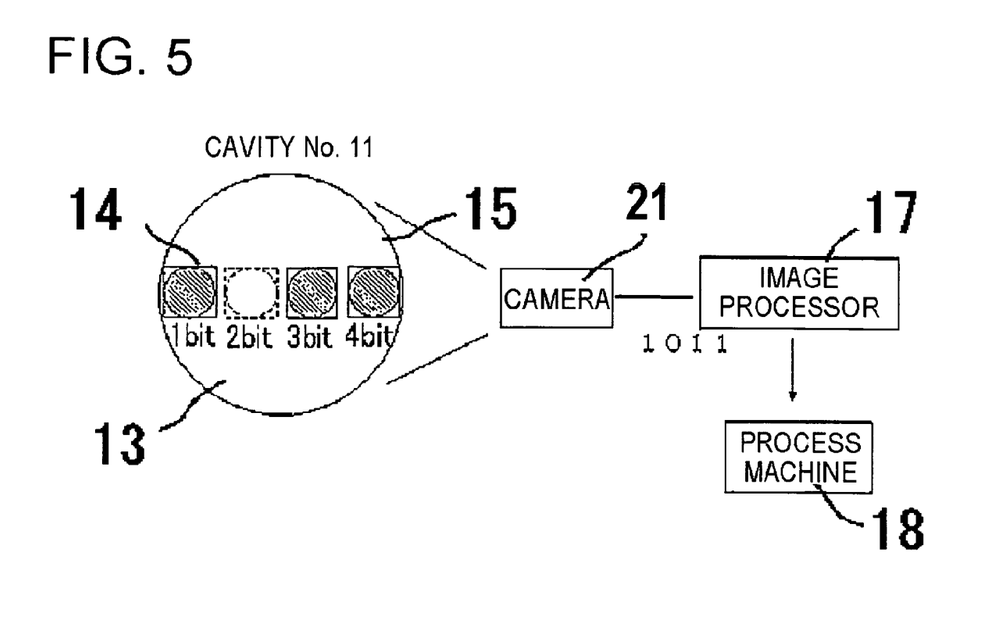
FIG. 5 is a drawing schematically showing a geometry reader used in an embodiment.

The following paragraphs will describe an exemplary method of reading the circular projections. FIG. 5 shows a configuration of a geometry reader.

First, image information for a predetermined area on the package 20 is captured using a camera 21 into an image processor 17. The image processor 17 sets a window 15 at a position of each defined circular projection on the surface of the package 20. That is, a window 15 is provided at each of the plurality of sub-areas. The image processor 17 executes an operation of judging presence or absence of the circular projection observed in each window 15.

Next, the image processor 17 converts the result of judgment into binary codes, expressing presence of the circular projection in the window 15 as "1", and absence thereof as "0", and transfers the binary codes to a process machine 18. The individual windows 15 herein are serially allocated to the fourth bit, third bit, second bit and first bit. Information on presence or absence of the circular projections is sent as a four-bit binary code using "1" and "0" from the image processor 17 to the process machine 18, so that a computer provided to the process machine 18 can identify a type of package 20 based on the binary-coded information.

As shown in FIG. 5, cavity number "11" in decimal number is expressed as "1011" in binary code. Assuming now that the window corresponded to each digit of bit of "1" has the circular projection, and that the window corresponded to each digit of bit of "0" has no circular projection, the image processor 17 reads the "1011" information and transfers the information to the process machine 18. The computer provided to the process machine 18 directly uses the "1011" information, and now can choose process condition number "11" in decimal number.

A method of setting the window may be such that a single window is set for the entire area, allowing counting of the number of geometric patterns observed therein, or may be based on pattern matching using a reference image preliminarily registered. The geometric pattern used herein may be any geometries other than circle, such as square, triangle and star, but is defined as including no characters such as Japanese "hiragana" and "C".

The paragraphs below will describe effects of the first embodiment.

Figure 6A:
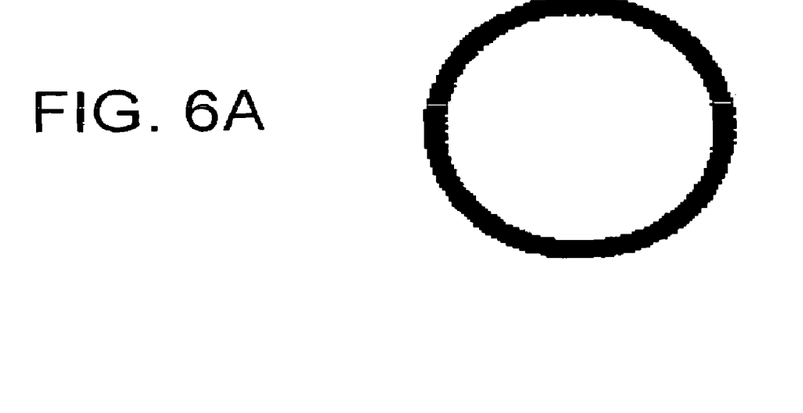
FIGS. 6A to 6C are drawings schematically showing stamp mark patterns marking patterns.
Figure 6B:
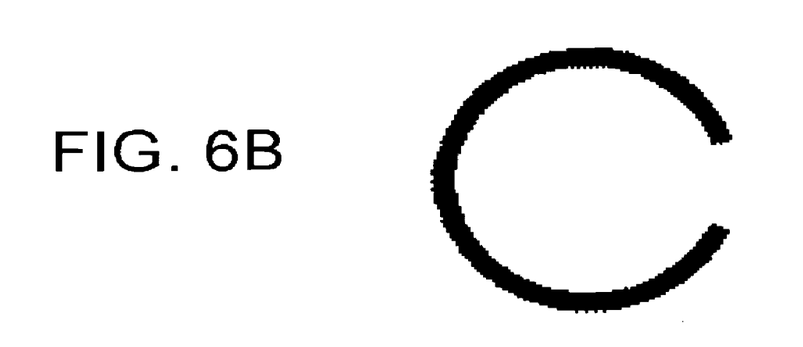
Figure 6C:
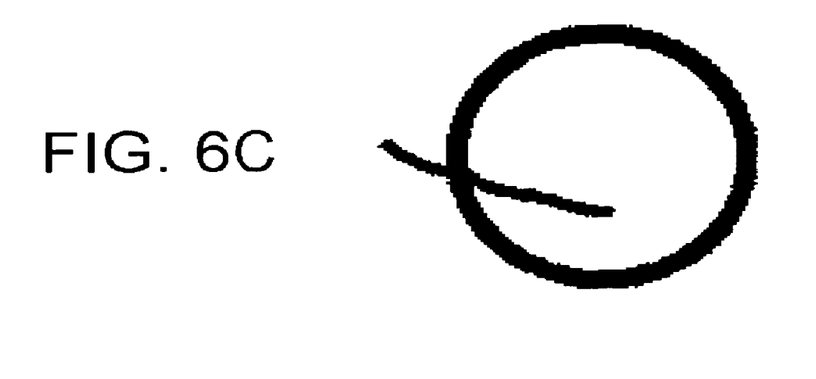

According to the first embodiment, in which the projections having a geometric pattern, such as the circular projections, are provided on the surface of the package using the ejector pin 11, and the image processor is allowed to judge only presence or absence of the circular projections, it is made possible to reduce a risk of misjudgment of the pattern even if the pattern has some omission in the constitutive line thereof or has any addition of a new line by accident. For an exemplary case where the circular projection as shown in FIG. 6A is provided on the surface of the package, the image processor 17 only reads presence or absence of the circular projection, even when disconnection shown in FIG. 6B or addition of a new line by some accident on the surface of the package shown in FIG. 6C should occur. This allows the image processor 17 to read the circular projection as being "present". It is therefore made possible to specify a type of the package 20 of the chip 7.

In the image processor 17 having, captured therein through the camera 21, image information of the stamp marking area 14 provided on the surface of the package 20, information on presence or absence of the geometric pattern such as circular pattern provided to the stamp marking area 14 is converted into a binary code. It is therefore made possible to send binary-coded information to the process machine 18 in a real-time manner, and to allow the computer to judge presence or absence of the circular projections in the stamp marking area 14 based on the information. It is therefore made possible to accurately identify a type of package 20 based on a result of the judgment.

Second Embodiment

The second embodiment differs from the first embodiment in that the geometry of the recesses provided to the end surface of the ejector pin has a bar code pattern.

The mold die used herein may be same with that used in the first embodiment.

As shown in FIG. 1, the ejector pin 11 having, carved on the end surface thereof, bar code recesses is set so that the end surface projects by 0.05 to 0.3 mm out from the bottom surface of the lower die 10. The chip 7 is bonded to the lead 8, the lead 8 is positioned to the lower die 10 and is clamped by the upper die 9, to thereby tightly enclose the chip 7. The sealing resin 19 is injected into the space 12 around the tightly enclosed chip 7, and cured therein, so as to give an outline of the package 20 having the bar code stamped thereon. The ejector pin land area 13 herein is given as a circular recess, and a stamp marking area 14 is given as having the bar code projections (projections and recesses).

Figure 7:
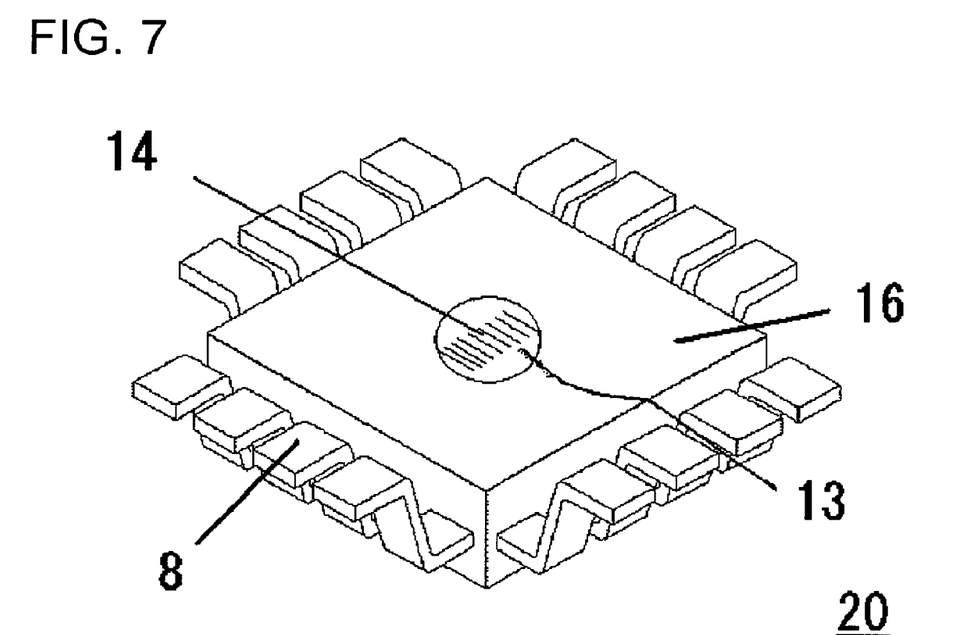
FIG. 7 is a perspective view showing a semiconductor device according to an embodiment.

Stamping of an one-dimensional bar code will give an appearance (rear perspective view) of the semiconductor device as shown in FIG. 7.

Figure 8:
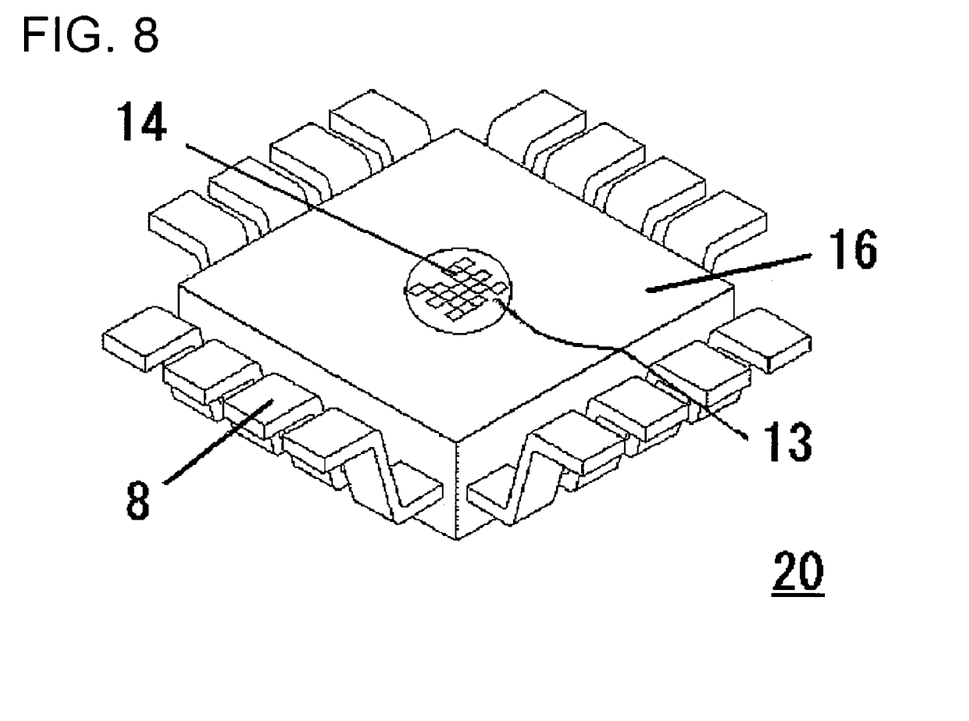
FIG. 8 is a perspective view showing a semiconductor device according to an embodiment.

Stamping of a two-dimensional bar code will give an appearance (rear perspective view) of the semiconductor device as shown in FIG. 8. It is allowable herein to provide the stamp marks to the ejector pin 11 of the top surface side similarly to as described in the first embodiment, or to provide the stamp marks to the cavity per se.

Geometry of the bar-code-patterned stamp mark of the second embodiment can be read typically by a method described below.

First, bar code information is read using a bar code reader.

Next, the captured bar code information is transferred to the process machine 18, and allows the computer of the process machine 18 to directly process the information, so as to modify process conditions. More specifically, the computer of the process machine 18 judges presence or absence of the projections at specific positions in the predetermined area based on the image information, detects a pattern of the bar code, and processes the information.

Effects of the second embodiment will be described below.

Also the bar code is a set of geometric patterns, and can therefore exhibit an effect of suppressing recognition failure due to disconnection of the line, addition of a new line and foul on the line, similarly to the circular projections explained in the first embodiment. The bar code, being enhanced in stability in geometry reading against disconnection of the line, addition of a new line and foul on the line, also makes it possible to ensure further stabilized geometry reading.

The bar code marked on the ejector pin 11 in the second embodiment is standardized, so that the reading can readily be carried out without need of any special reading system. This makes it possible to specify the package types, and to stably read information of cavity number of the mold die 100 used for molding the chip 7.

Similarly to as described in the first embodiment, the information on the geometry, captured through a camera into the image processor 17 and extracted in a form of binary-coded information, can be sent to the process machine 18 in a real-time manner, and can directly be processed by the computer.

The embodiments of the present invention have been described referring to the attached drawings, merely as examples of the present invention, allowing adoption of various configurations other than those described in the above.

For example, the above embodiments dealt with the recesses provided to the ejector pin or to the cavity as a stamp mark having a geometric pattern, such as circular pattern, or a bar code pattern, but also allow any other stamp marks of any other geometries so far as they have projected forms and can accurately be recognized by the image processor.

The above-described embodiments explained the cases using a semiconductor chip as the chip 7, but allow use of any other active elements, or any other passive elements such as resistor, capacitor and so forth.

The above-described embodiments explained the cases using the projections provided at four positions on the surface of the package, but allow use of projections provided at a plurality of positions such as two positions or five positions or more, and even allow use of a projection at a single position.

What is claimed is:

1. A semiconductor device comprising:
   a chip; and
   a package for sealing said chip therein;
   wherein, said package has, on the surface thereof, a region in which a projection indicating binary data may be formed, and said package is configured so as to allow determination of a package type of said semiconductor device by judging presence or absence of said projection in said region.

2. The semiconductor device according to claim 1, wherein said projection is provided corresponding to an ejector pin provided to a die configured for fabrication of said package.

3. The semiconductor device according to claim 1, wherein said projection is provided corresponding to a recess provided to a die.

4. The semiconductor device according to claim 1, wherein said projection is provided at a predetermined position in said region, depending on said package types.

5. The semiconductor device according to claim 1, wherein said region has a plurality of predetermined positions.

6. The semiconductor device according to claim 1, wherein said projection has a geometric pattern.

7. A semiconductor device comprising:
a chip; and
a package for sealing said chip therein;
wherein, said package has, on the surface thereof, a region in which a projection may be formed, and said package is configured so as to allow determination of a package type of said semiconductor device by judging presence or absence of said projection in said region,
wherein said projection has a bar code pattern.

8. The semiconductor device according to claim 7, wherein said bar code pattern is a one-dimensional bar code pattern.

9. The semiconductor device according to claim 7, wherein said bar code pattern is a two-dimensional bar code pattern.

10. The semiconductor device according to claim 1, wherein said region has a plurality of sub-areas, and said projection is provided to any specific sub-area depending on the package type.

11. The semiconductor device according to claim 1, wherein the presence of the projection indicates a "1" and the absence of the projection indicates a "0".

12. The semiconductor device according to claim 1, wherein the projection is a circular projection.

13. The semiconductor device according to claim 1, wherein the projection is a circular projection approximately 1 mm in diameter.

14. The semiconductor device according to claim 1, wherein the data identifies a type of package.

* * * * *